United States Patent [19]

Tracy

[11] Patent Number: 5,315,483

[45] Date of Patent: May 24, 1994

[54] HOUSING HAVING NON-PLANAR RADIAL SEAL

[75] Inventor: James L. Tracy, Margate, Fla.

[73] Assignee: Motorola, Inc., Schaumburg, Ill.

[21] Appl. No.: 956,219

[22] Filed: Oct. 5, 1992

[51] Int. Cl.⁵ .............................................. H05K 5/06
[52] U.S. Cl. ................................. 361/752; 174/52.3; 277/207 R; 361/796; 361/814
[58] Field of Search ............... 220/344, 357, 358, 378, 220/614; 174/52.3; 361/380, 390, 422, 679, 724, 814, 730, 752, 796; 277/207 R, 228

[56] References Cited

U.S. PATENT DOCUMENTS 4,225,970 9/1980 Jaramillo et al. .
4,418,830 12/1983 Dzung et al. .................... 220/614
5,155,659 10/1992 Kunert ......................... 361/422 X
5,157,577 10/1992 Balaud et al. ..................... 361/390

Primary Examiner—Leo P. Picard
Assistant Examiner—Michael W. Phillips
Attorney, Agent, or Firm—Pablo Meles; Leslie A. Rhyne

[57] ABSTRACT

A housing (10) comprises a first housing member (12) having a rib (14) about a substantial portion of the periphery of the first housing member, the rib being on at least two planes (22 and 24). A second housing member (30) having protrusions (32) on portions of the second housing member guides an O-ring (17) towards portions of the rib about the periphery of the first housing member. The O-ring placed on the rib of the first housing member aides in forming a radial seal when the second housing member is coupled to the first housing member.

16 Claims, 4 Drawing Sheets

HOUSING HAVING NON-PLANAR RADIAL SEAL

TECHNICAL FIELD

This invention relates generally to radial seals in general and particularly to a radial seal for a non-planar seal joint.

BACKGROUND

Compression seals are common among portable products requiring environmental and water sealing. Some compression seals are used on products requiring sealing on more than one plane. For example, Motorola's watch pagers typically use compression seals for sealing a non-planar housing. Compression sealing typically provides a strong seal, but increased cost in terms of manufacturing, assembly time, and parts. Compression seals typically require a compression force on opposing housings applied by clamping or screws. Radial seals are generally easier in assembly and usually cost less in terms of parts. But when a seal is required for a non-planar housing, radial seals have not been found to exist. Since radial seals are generally restricted to one plane, design flexibility is hampered. For instance, if some features on a radio require sealing while other features do not, there are limitations dependent on the location of a planar radial seal as to where those features have to be within the product. Sealed features and non-sealed features will have to be located on opposing sides of the single plane of the seal. Therefore, a need exists for implementing a lower cost radial seal in a non-planar housing that would provide greater design flexibility.

Referring to FIG. 1, a conventional radial seal 6 is formed between a first housing member 1 and a second housing member 2. The radial seal 6 is typically formed using an O-ring 3 having an unloaded diameter 4 as indicated. The O-ring is radially compressed to form a loaded diameter 5 which is typically the width of the channel between the two housing members. The conventional O-ring is mounted on a single plane to provide an equivalent radial force (or horizontal force shown by 4) throughout the perimeter of the entire O-ring. If the housings members were compressed sufficiently to deform the O-ring 3 to the extent of forcing the O-ring to touch the bottom portion 2 of the second housing member, a radial seal would no longer exist; Rather, a compression seal would be formed since a partial vertical force would be applied to the O-ring 3. Thus, a true radial seal would have no vertical forces (in the orientation shown) and only horizontal forces or radial forces.

SUMMARY OF THE INVENTION

A non-planar radial seal for a housing comprises a first housing member and a second housing member for mating with the first housing member with a compressible perimeter seal formed between the first and second housing members. The first and second housing members include features for guiding the perimeter seal into a non-planar orientation.

DETAILED DESCRIPTION OF THE PREFERRED EMBODIMENT

Figure 1:
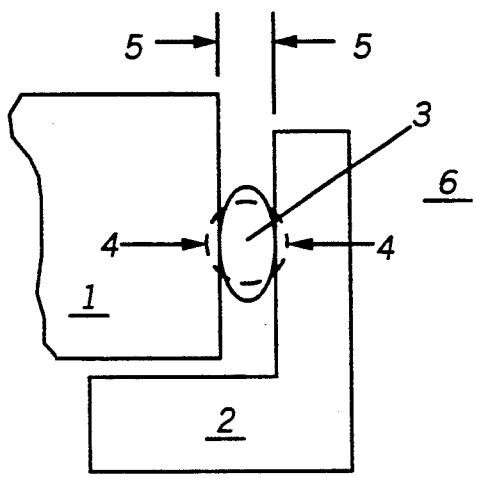
FIG. 1 is a cross-sectional view of a conventional radial seal.
Figure 2:
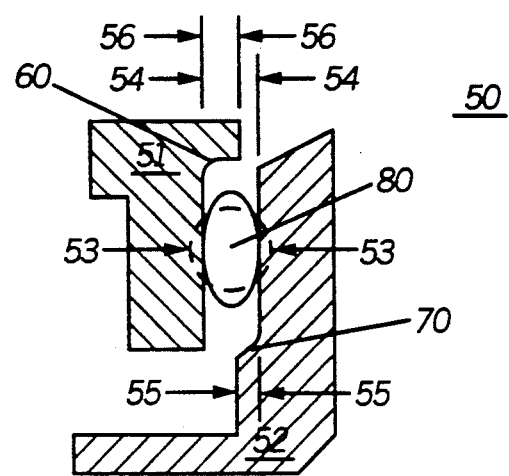
FIG. 2 is a cross-sectional view of a radial seal in accordance with the present invention.

Referring to FIG. 2, there is shown a cross-sectional view of a radial seal 50 in accordance with the present invention. As in the conventional seal 6, the radial seal 50 is formed preferably using an O-ring 80 between a first housing member 51 and a second housing member 52. And this is where the similarity ends since the present invention provides for a non-planar radial seal. Complementary means (60 and 70 respectively) formed on the first and second housing members guide the perimeter seal or O-ring 80 into a non-planar orientation. The O-ring 80 does not need to touch either of the complementary means 60 or 70 after housings are loaded or mounted together in order to maintain a seal.

Assuming the width of the uncompressed diameter 53 of the O-ring 80 is X, the compressed diameter 54 is preferably 0.8 X or 80% of X. Thus, the width of the channel between the housing members would also be 0.8 X. The complementary means 60 or rib (see FIG. 3, item 14) preferably has a cross-sectional width 56 between at least half the diameter of the uncompressed O-ring and less than 80% of the uncompressed diameter of the O-ring (between 0.5 X and 0.8 X). Likewise, the complementary means 70 or protrusion (see FIG. 4, item 32) preferably has a cross-sectional width 55 between 0.5 X and 0.8 X off of the seal surface of the second housing member 52. Although the proportional ranges herein described are preferred, other combinations could be possible as long as the width or "height" of the protrusions (60 or 70) off of the respective housing sealing surfaces are not greater than the compressed width of the seal or O-ring 80. If the width of the protrusion off of the housing sealing surface (55 or 56) is greater than the compressed width of the O-ring, then a seal would not occur. In effect, you would have two hard surfaces (51 and 52) compressed against each other, providing an ineffective seal.

Figure 3:
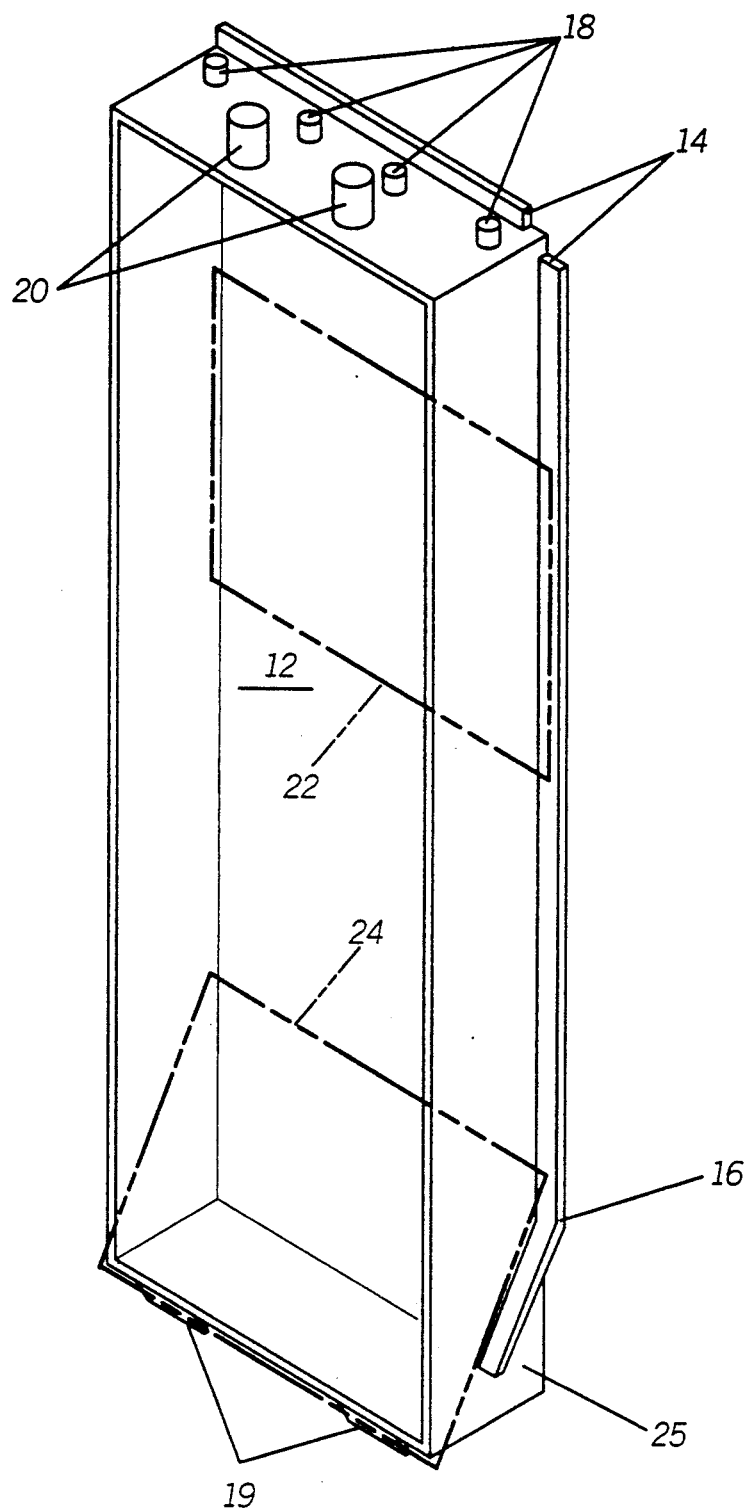
FIG. 3 is a perspective view of a housing member for a communication product having a non-planar radial seal in accordance with the present invention.
Figure 4:
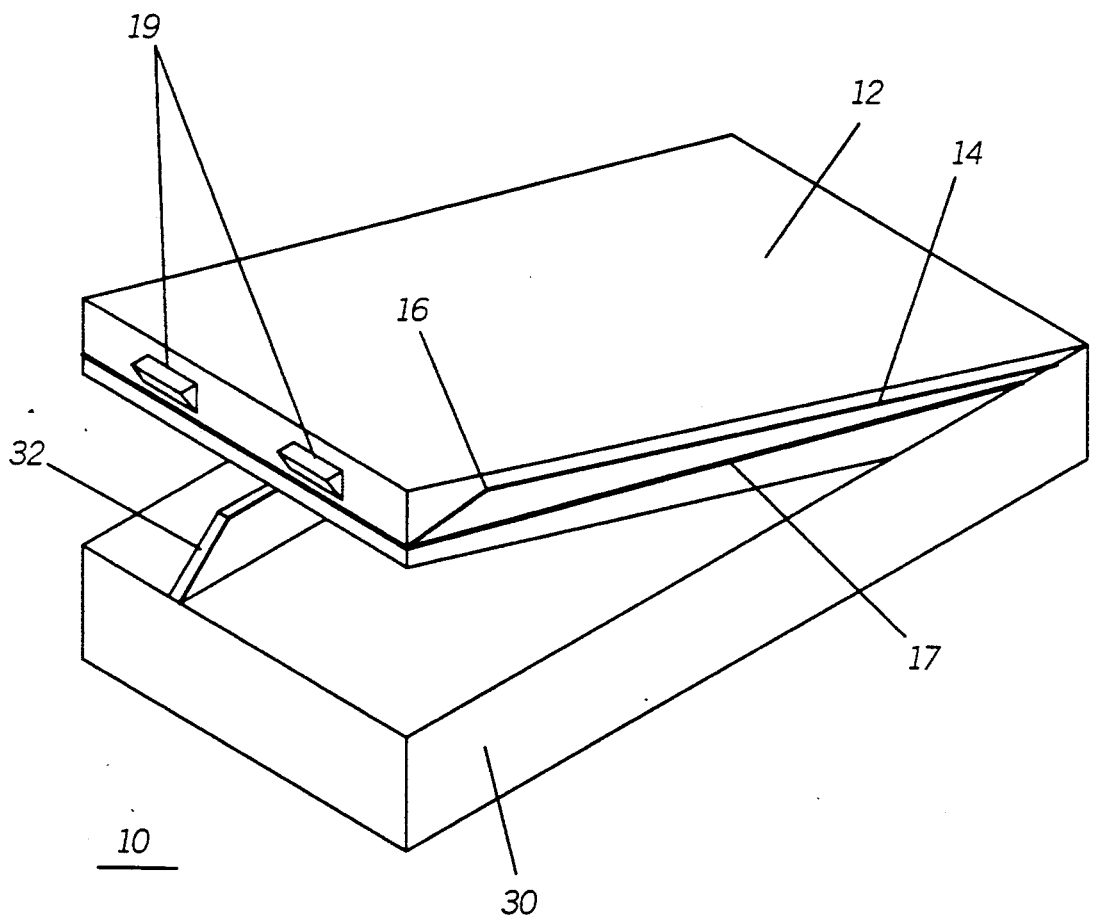
FIG. 4 is perspective view of a communication product having a non-planar radial seal in accordance with the present invention.

Referring to FIGS. 3 and 4, there is shown a perspective view of a housing 10 for an electronic product such as a two-way radio, pager, or lap-top computer having a non-planar radial seal in accordance with the present invention. The housing 10 comprises a first housing member 12 and a second housing member 30 both preferably made of a hard plastic such as polycarbonate, although other materials such as aluminum, steel and other plastics could be used. A means for forming a non-planar radial seal exists between the first housing member 12 and the second housing member 30. The means for forming the non-planar seal should be a compressible or compliant perimeter seal formed between the first and second housing members, preferably an O-ring 17 made of compressible rubber material. Alternatively, the cross-sectional shape of the ring seal could by of any shape such as a hexagonal, star or square as long as the ring seal is a closed loop. Finally, complementary means formed on the first and second housing members guide the perimeter seal or O-ring 17 into a non-planar orientation.

The complementary means could comprise of an integral rib 14 about a substantial portion of the periphery of the first housing member 12 and protrusions on portions of the second housing member for guiding the O-ring towards portions of the rib 14 about the periphery of the first housing member. The rib should at least traverse two planes (22 and 24). Referring to FIGS. 3 and 4, a second housing member 30 mates with the first housing member 12. In other words, a seal following the contour of the rib 14 on the first housing member 12 exists. The seal is formed preferably using an O-ring 17 about the periphery of the first housing 12. The first housing member 12 further includes O-ring guide posts 18 on one end of the member 12 and O-ring guide posts 19 on the opposing end of the member 12.

In assembly, the O-ring 17 is placed around the periphery of the first housing member 12. The O-ring 17 is initially set in one plane preferably using the guide post 18 and 19 for planar retention. As the housing member 12 is mounted into the second housing member 30, the protrusions 32 in the second housing member 30 guide the O-ring 17 towards the rib portions (14) about the periphery of the first housing member 12. The protrusions 32 substantially complement, mimic or mate with the pattern of the rib 14 in the first housing, thereby causing the O-ring to conform to a non-planar pattern, thereby providing a non-planar radial seal. In FIG. 4 the O-ring 17 conforms into two planes via a gentle slope 16. In this manner, features designed to be either exposed or sealed can be easily incorporated into a product housing. For example, features 20 such as a volume pot, which should be within a radio's seal area would be designed in an area behind the rib 14. Alternatively, if the feature did not require sealing or if sealing was not desired, the feature could be incorporated into the area 25. Thus, the present invention provides greater design flexibility with the use of a non-planar radial seal.

Figure 5:
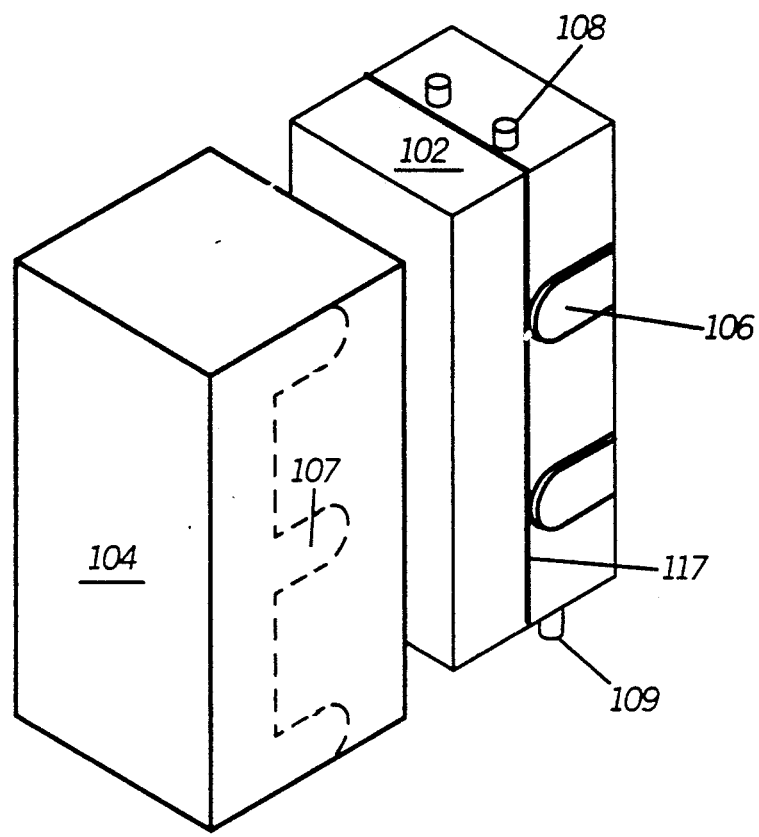
FIG. 5 is a perspective view of an alternative embodiment having a non-planar radial seal in accordance with the present invention.
Figure 6:
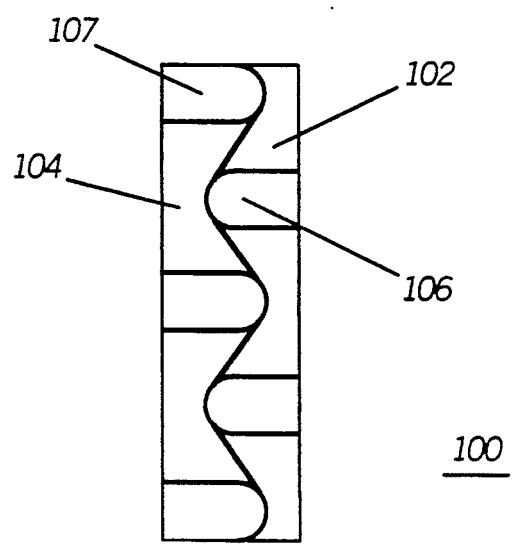
FIG. 6 is a side elevational view of the alternative embodiment of FIG. 5 after assembly in accordance with the present invention.

Referring to FIGS. 5 and 6, there is shown a second embodiment in accordance with the present invention. A housing 100 comprises a first housing member 102 and a second housing member 104 having a compressible perimeter seal such as an O-ring 117 formed between the first and second housing members. The housing 100 additionally includes complementary means formed on the first and the second housing members for guiding the perimeter seal into a non-planar orientation. In this embodiment, the complementary means are opposing complementary finger shaped bumps or protrusions (106 and 107 respectively) on the first and second housing members. The protrusions 107 shown as a dashed line in FIG. 5 are on an internal portion of the housing member 104.

Once again, in assembly, the O-ring is placed around the periphery of one of the housing members in a single plane orientation. In this embodiment the O-ring 17 is place around the first housing member 102 using guide posts 108 and 109 on opposing sides of the first housing member for planar retention. As the second housing member 104 is mounted onto housing member 102, the protrusions 106 and 107 guide the O-ring 117 about the periphery of the housing in a non-planar orientation in a wave pattern as shown in the side view FIG. 6. The protrusions 106 and 107 complement each other in forming the desired designed non-planar radial seal pattern.

Although two embodiments are shown, other embodiments are contemplated within the scope and spirit of the present invention which would provide a non-planar radial seal. For instance, the rib 14 could have an infinite number of patterns such as a sawtooth or square wave pattern which would mate with a housing have similar corresponding patterns for guiding an O-ring into the desired pattern.

What is claimed is:

1. A housing having a non-planar radial seal, comprising:
   a first housing member having a first perimeter;
   a second housing member for mating with the first housing member, said second housing member having a second perimeter that is larger than the first perimeter so that when the first housing member is mated with the second housing member a gap is formed between the first housing member and the second housing member, said gap having a width;
   a perimeter seal formed in the gap between the first housing member and the second housing member, said perimeter seal comprising a compliant material having a cross sectional diameter that is larger than the width of the gap; and
   complementary means formed on the first housing member and the second housing members for guiding the perimeter seal into a non-planar orientation.

2. The housing of claim 1, wherein the compliant material comprises an O-ring.

3. The housing of claim 1, wherein the complementary means comprises a rib on the first housing member and a complementary protrusion on the second housing.

4. The housing of claim 1, wherein the complementary means comprises complementary opposing protrusions on the first and second housing members.

5. A housing having a non-planar radial seal, comprising:
   a first housing member having a rib about a substantial portion of a periphery of the first housing member, said rib being on at least two planes;
   a second housing member for receiving the first housing member so that when said first housing member is disposed within the second housing member a gap is formed between the first housing member and the second housing member, the gap having a width; and
   means for forming a non-planar radial seal in the gap between the first housing member and the second housing member comprising a compliant material having a cross sectional diameter that is larger than the width of the gap.

6. The housing of claim 5, wherein the compliant material comprises an O-ring.

7. The housing of claim 6, wherein the first housing member has O-ring guide posts for planar retention before final assembly of the first housing member and the second housing member.

8. The housing of claim 6, wherein the second housing member has protrusions on portions of the second housing member for guiding the O-ring towards portions of the rib about the periphery of the first housing member.

9. A housing for an electronic product, said housing having a non-planar radial seal, comprising:

a first housing member containing electronic circuitry for the electronic product, the housing member having a first perimeter;

a second housing member for mating with the first housing member, said second housing member having a second perimeter that is larger than the first perimeter so that when the first housing member is mated with the second housing member a gap is formed between the first housing member and the second housing member, said gap having a width;

a perimeter seal formed in the gap between the first housing member and the second housing member, said perimeter seal comprising a compliant material having a cross sectional diameter that is larger than the width of the gap; and complementary means formed on the first housing member and the second housing members for guiding the perimeter seal into a non-planar orientation.

10. The housing of claim 9, wherein the electronic product comprises a two-way radio.

11. The housing of claim 9, wherein the compliant material comprises an O-ring.

12. The housing of claim 11, wherein the first housing member has O-ring guide posts for planar retention before final assembly of the first housing member and the second housing member.

13. The housing of claim 9, wherein the second housing member has protrusions on portions of the second housing member for mating with portions of a rib about a periphery of the first housing member.

14. An electronic product having a non-planar radial seal, comprising a first housing member containing electronic circuitry for the electronic product and having a rib about a substantial portion of a periphery of the first housing member, the rib being on at least two planes, the first housing member having a first perimeter;

a second housing member having protrusions on portions of the second housing member for mating with portions of the rib about the periphery of the first housing member, said second housing member having a second perimeter being larger than the first perimeter so that when the first housing member is mated with the second housing member a gap is formed between the first housing member and the second housing member, said gap having a width; and an O-ring having a cross sectional diameter that is larger than the width of the gap, said O-ring being placed within the gap and on the rib of the first housing member, said O-ring forming a radial seal when the second housing member is coupled to the first housing member.

15. The electronic product of claim 14, wherein the first housing member has O-ring guide posts for planar retention before final assembly of the first and second housing members.

16. The electronic product of claim 14, wherein the electronic product comprises a two-way radio.

* * * * *